United States Patent
Mizutani et al.

(10) Patent No.: US 9,578,755 B2
(45) Date of Patent: Feb. 21, 2017

(54) PRINTED WIRING BOARD HAVING BUILDUP LAYERS AND MULTILAYER CORE SUBSTRATE WITH DOUBLE-SIDED BOARD

(71) Applicant: IBIDEN CO., LTD., Ogaki-shi (JP)

(72) Inventors: Yoshio Mizutani, Ogaki (JP); Hiroaki Watanabe, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 322 days.

(21) Appl. No.: 14/255,986

(22) Filed: Apr. 18, 2014

(65) Prior Publication Data

US 2014/0311772 A1    Oct. 23, 2014

(30) Foreign Application Priority Data

Apr. 23, 2013    (JP) ................. 2013-090362

(51) Int. Cl.
H05K 3/46    (2006.01)
H05K 3/42    (2006.01)
H01L 23/498    (2006.01)

(52) U.S. Cl.
CPC ......... *H05K 3/462* (2013.01); *H05K 3/429* (2013.01); *H01L 23/49827* (2013.01); *H01L 2924/0002* (2013.01); *H05K 2201/0959* (2013.01); *H05K 2201/09509* (2013.01); *H05K 2203/1476* (2013.01); *Y10T 29/49165* (2015.01)

(58) Field of Classification Search
None
See application file for complete search history.

(56) References Cited

U.S. PATENT DOCUMENTS

| | | | | |
|---|---|---|---|---|
| 3,322,881 A | * | 5/1967 | Polichette | H05K 3/429 174/266 |
| 3,606,677 A | * | 9/1971 | Ryan | H05K 3/429 156/313 |
| 4,211,603 A | * | 7/1980 | Reed | H05K 3/429 174/266 |

(Continued)

FOREIGN PATENT DOCUMENTS

JP    2001-127434    5/2001

*Primary Examiner* — Chau N Nguyen
*Assistant Examiner* — Muhammed Azam
(74) *Attorney, Agent, or Firm* — Oblon, McClelland, Maier & Neustadt, L.L.P.

(57) ABSTRACT

A printed wiring board includes: a multilayer core substrate including first and second insulation layers and a double-sided board between the first and second insulation layers. The core substrate has a cylindrical through-hole structure including a cylindrical conductor through the insulation layers and the board, a resin filler filling inside the cylindrical conductor and covering circuits covering the filler at the ends of the cylindrical conductor, respectively. The core substrate includes a conductive layer including a through-hole land around end of the structure such that the land is directly connected to the cylindrical conductor, the land includes a first electroless film, a first electrolytic film, a second electroless film and a second electrolytic film, and the cylindrical conductor includes the second electroless and electrolytic films such that the second electroless film is in contact with the side walls of the first electroless and electrolytic films.

14 Claims, 12 Drawing Sheets

(56) References Cited

U.S. PATENT DOCUMENTS

| | | | | |
|---|---|---|---|---|
| 4,285,780 A * | 8/1981 | Schachter | | H05K 3/423 205/120 |
| 6,376,049 B1 * | 4/2002 | Asai | | H05K 3/0094 174/250 |
| 6,426,011 B1 * | 7/2002 | Katoh | | H05K 3/0094 216/105 |
| 2002/0122283 A1 * | 9/2002 | Higashi | | H01G 9/028 361/271 |
| 2004/0128822 A1 * | 7/2004 | Tung | | H05K 1/162 29/592.1 |
| 2004/0136152 A1 * | 7/2004 | Mitsuhashi | | H05K 3/4602 174/262 |
| 2004/0222015 A1 * | 11/2004 | Ohsumi | | H05K 3/427 174/250 |
| 2005/0056939 A1 * | 3/2005 | Ooi | | H01G 4/10 257/761 |
| 2005/0236177 A1 * | 10/2005 | Inagaki | | H01L 23/49816 174/255 |
| 2005/0258522 A1 * | 11/2005 | En | | C23G 1/10 257/670 |
| 2006/0012967 A1 * | 1/2006 | Asai | | G02B 6/43 361/764 |
| 2006/0060558 A1 * | 3/2006 | Maeng | | C23F 1/02 216/13 |
| 2006/0131069 A1 * | 6/2006 | Shimizu | | H01L 21/4857 174/260 |
| 2006/0263003 A1 * | 11/2006 | Asai | | G02B 6/4204 385/14 |
| 2007/0289773 A1 * | 12/2007 | Caletka | | H05K 1/0219 174/262 |
| 2008/0014768 A1 * | 1/2008 | Lee | | H05K 3/429 439/77 |
| 2008/0277146 A1 * | 11/2008 | Hwang | | H05K 3/429 174/255 |
| 2009/0205859 A1 * | 8/2009 | Tanaka | | H01L 24/18 174/260 |
| 2009/0277679 A1 * | 11/2009 | Jung | | H05K 3/429 174/266 |
| 2010/0051323 A1 * | 3/2010 | Yokouchi | | B82Y 10/00 174/250 |
| 2011/0114372 A1 * | 5/2011 | Kato | | H05K 1/115 174/256 |
| 2014/0311772 A1 * | 10/2014 | Mizutani | | H05K 3/429 174/251 |
| 2015/0271917 A1 * | 9/2015 | Choi | | H05K 3/429 174/251 |

* cited by examiner

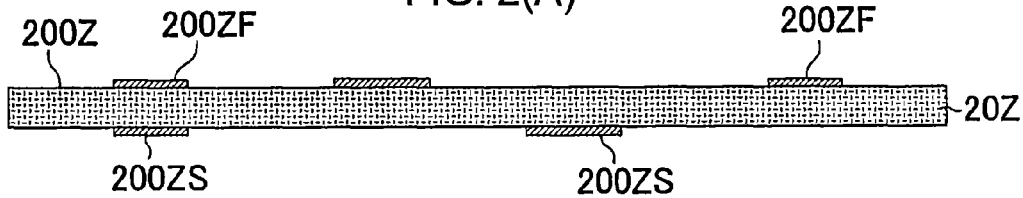
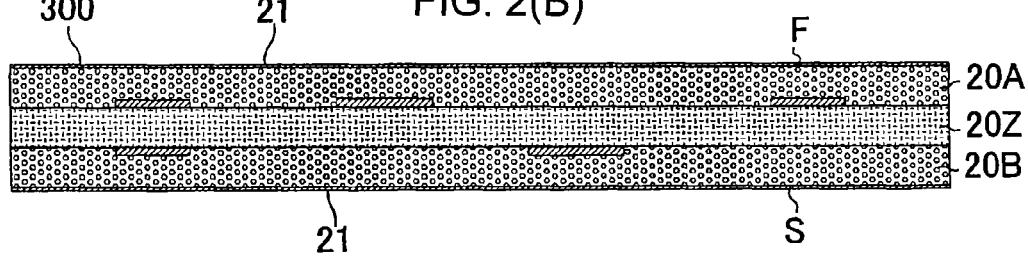
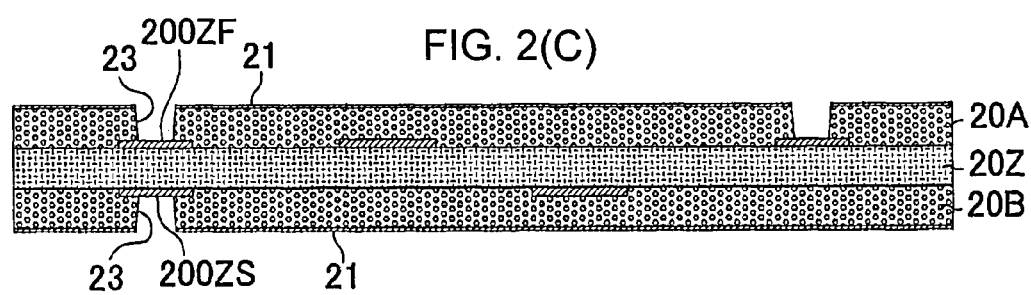
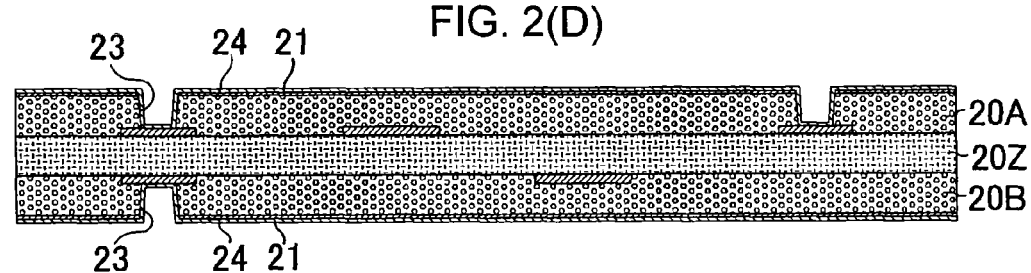
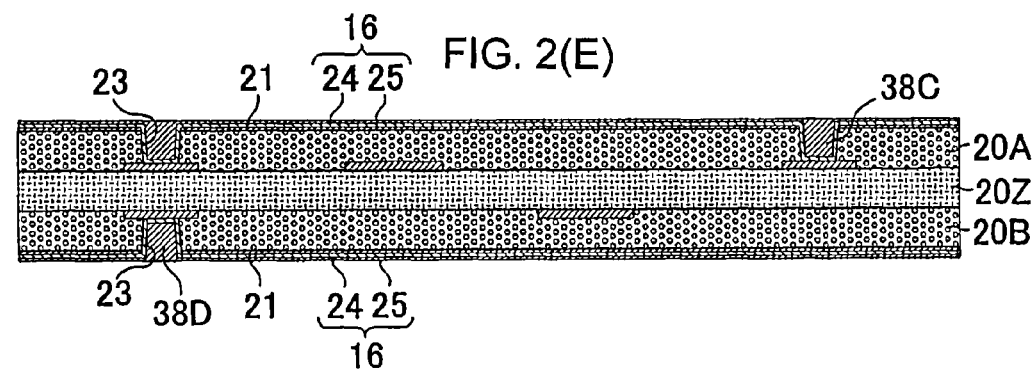

PRINTED WIRING BOARD HAVING BUILDUP LAYERS AND MULTILAYER CORE SUBSTRATE WITH DOUBLE-SIDED BOARD

CROSS-REFERENCE TO RELATED APPLICATIONS

The present application is based upon and claims the benefit of priority to Japanese Patent Application No. 2013-090362, filed Apr. 23, 2013, the entire contents of which are incorporated herein by reference.

BACKGROUND OF THE INVENTION

Field of the Invention

The present invention relates to a multilayer core substrate having a via conductor and a through-hole conductor, to a printed wiring board having the multilayer core substrate, and to a method for manufacturing the multilayer core substrate.

Description of Background Art

In Laid-open Japanese Patent Publication 2001-127434, an interlayer resin insulation layer is formed on surfaces of a core substrate, penetrating holes for through-hole conductors are formed in the core substrate and interlayer resin insulation layers laminated on both surfaces of the core substrate, then openings for via conductors are formed in the interlayer insulation layers laminated on both surfaces of the core substrate, and subsequently plated film is formed simultaneously in openings for through-hole conductors and openings for via conductors. Resin is filled in via conductors. The entire contents of this publication are incorporated herein by reference.

SUMMARY OF THE INVENTION

According to one aspect of the present invention, a printed wiring board includes: a multilayer core substrate including a first insulation layer, a second insulation layer and a double-sided board interposed between the first insulation layer and the second insulation layer; a first buildup layer formed on a first surface of the multilayer core substrate; and a second buildup layer formed on a second surface of the multilayer core substrate. The multilayer core substrate has a first conductive layer formed on the first insulation layer, a second conductive layer formed between the first insulation layer and the double-sided board, a third conductive layer formed between the second insulation layer and the double-sided board, a fourth conductive layer formed on the second insulation layer, and a cylindrical through-hole structure including a cylindrical conductor formed on the wall of a penetrating hole penetrating through the first insulation layer, the double-sided board and the second insulation layer such that the cylindrical conductor is connecting the first conductive layer and the fourth conductive layer, a resin filler filling the space formed inside the cylindrical conductor and covering circuits covering the resin filler at the ends of the cylindrical conductor, respectively, the first conductive layer includes a first through-hole land formed around one end of the cylindrical through-hole structure such that the first through-hole land is directly connected to the cylindrical conductor, the first through-hole land includes a first electroless plated film, a first electrolytic plated film formed on the first electroless plated film, a second electroless plated film formed on the first electrolytic plated film and a second electrolytic plated film formed on the second electroless plated film, and the cylindrical conductor includes the second electroless plated film and the second electrolytic plated film formed on the second electroless plated film such that the second electroless plated film is in contact with the side walls of the first electroless plated film and first electrolytic plated film exposed by the penetrating hole of the multilayer core substrate.

According to another aspect of the present invention, a method for manufacturing a printed wiring board includes preparing an intermediate substrate including a first insulation layer, a second insulation layer and a double-sided board interposed between the first insulation layer and the second insulation layer, forming a penetrating hole penetrating through the first insulation layer, the double-sided board and the second insulation layer, forming a cylindrical conductor on the wall of the penetrating hole, filling a resin filler in the space formed inside the cylindrical conductor, and forming covering circuits covering the resin filler at the ends of the cylindrical conductor, respectively, such that a cylindrical through-hole structure penetrating through the first insulation layer, the double-sided board and the second insulation layer is formed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2(A)-2(E) show views of processing steps of a method for manufacturing a printed wiring board according to the first embodiment;

DETAILED DESCRIPTION OF THE EMBODIMENTS

Figure 1:
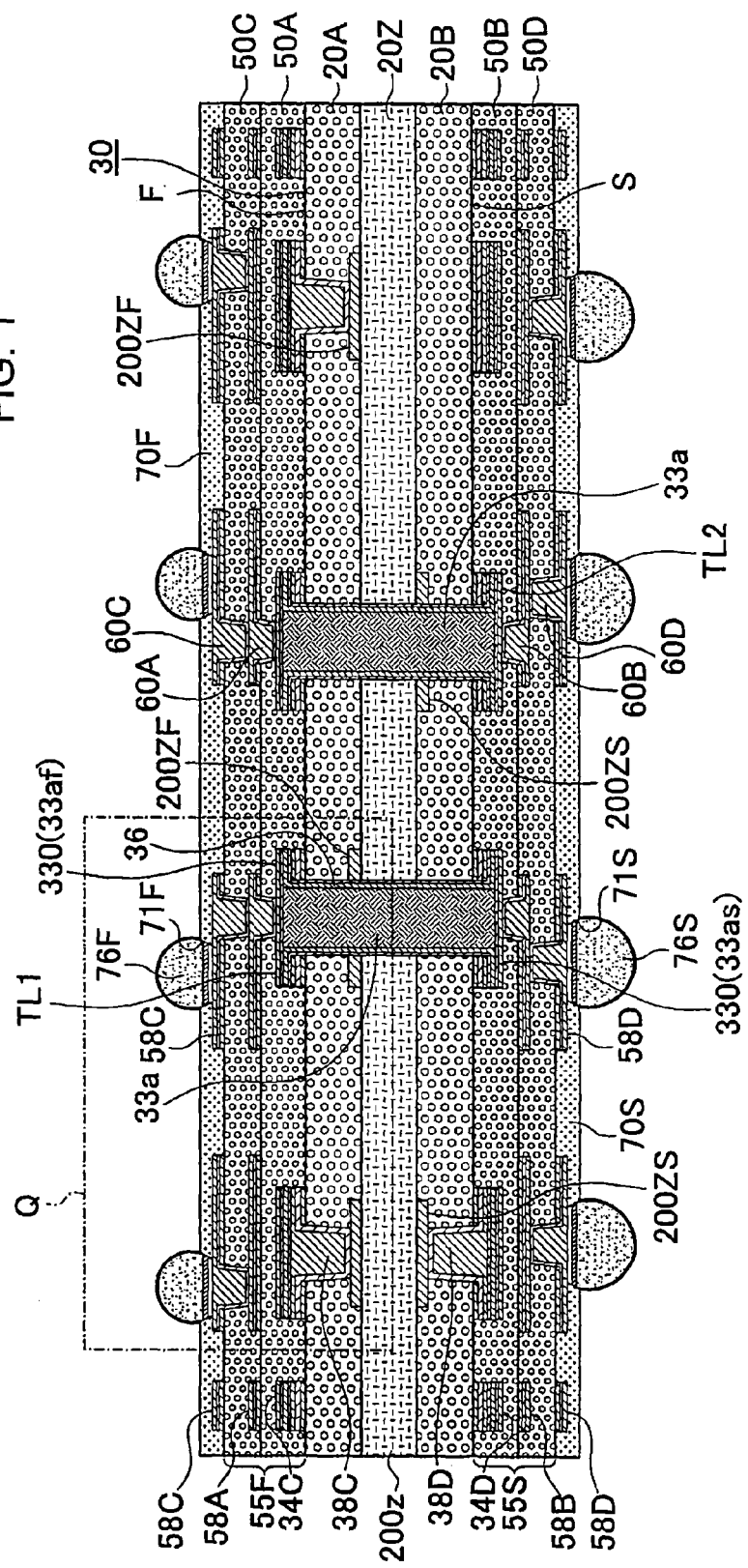
FIG. 1 is a cross-sectional view of a printed wiring board according to a first embodiment of the present invention.

The embodiments will now be described with reference to the accompanying drawings, wherein like reference numerals designate corresponding or identical elements throughout the various drawings.

First Embodiment

A printed wiring board according to a first embodiment of the present invention is described with reference to a cross-sectional view shown in FIG. 1. Printed wiring board 10 of the first embodiment is provided with multilayer core substrate 30 having first main surface (F) and second main surface (S) opposite first main surface (F), upper buildup layer (55F) formed on the first main surface of the multilayer core substrate, and lower buildup layer (55S) formed under the second main surface of the multilayer core substrate.

Multilayer core substrate 30 includes double-sided board (200z), which is made up of insulation layer (20Z) having an upper surface and a lower surface opposite the upper surface, upper conductive layer (200ZF) formed on the upper surface of insulation layer (20Z), and lower conductive layer (200ZS) formed under the lower surface. Moreover, multilayer core substrate 30 includes first insulation layer (20A) having a first surface and a second surface opposite the first surface, and second insulation layer (20B) having a third surface and a fourth surface opposite the third surface. Double-sided board (200z) is formed between the first insulation layer and the second insulation layer. In FIG. 1, the double-sided board is sandwiched between the second surface of the first insulation layer and the third surface of the second insulation layer. The multilayer core substrate further includes first conductive layer (34C) formed on the first surface of the first insulation layer, and fourth conductive layer (34D) formed under the fourth surface of the second insulation layer. There are four conductive layers in the multilayer core substrate of the printed wiring board shown in FIG. 1; the second conductive layer formed under the second surface of the first insulation layer corresponds to upper conductive layer (200ZF) of the double-sided board, and the third conductive layer formed on the third surface of the second insulation layer corresponds to lower conductive layer (200ZS) of the double-sided board.

The multilayer core substrate includes first via conductor (38C), which penetrates through the first insulation layer and connects the first conductive layer and the second conductive layer.

The multilayer core substrate includes second via conductor (38D), which penetrates through the second insulation layer and connects the fourth conductive layer and the third conductive layer.

The multilayer core substrate includes through-hole conductor 36, which penetrates through first insulation layer (20A), insulation layer (20Z) of the double-sided board and second insulation layer (20B). The first conductive layer and the fourth conductive layer are connected by the through-hole conductor. The through-hole conductor of the present embodiment is shaped to be cylindrical.

The first conductive layer of the multilayer core substrate has first through-hole land (TL1), and the fourth conductive layer of the multilayer core substrate has second through-hole land (TL2). Such a through-hole land is a conductive circuit formed surrounding a through-hole conductor and directly connected to the through-hole conductor.

Figure 11A:
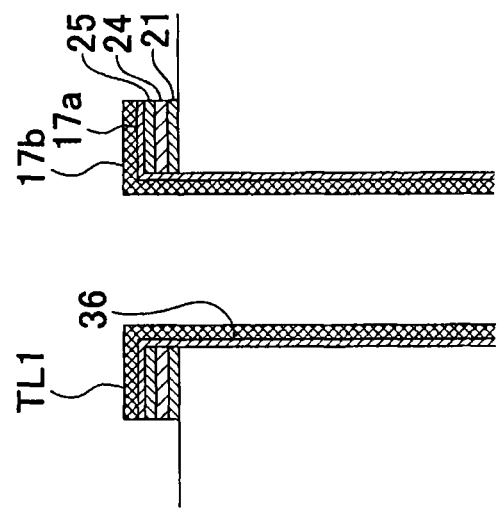
FIG. 11(A)-11(B) are cross-sectional views showing a through-hole land and part of a through-hole conductor.

FIG. 11(A) shows part of penetrating hole 31 for a through-hole conductor, metal foil 21, first electroless plated film 24 and first electrolytic plated film 25 which form a through-hole land. As shown in FIG. 11(A), a side wall of metal foil 21, a side wall of first electroless plated film 24 and a side wall of first electrolytic plated film 25 are exposed by the penetrating hole for a through-hole conductor. Second electroless plated film (17a) of the through-hole conductor is formed on the side walls of metal foil 21, first electroless plated film 24 and first electrolytic plated film 25 that are exposed by the penetrating hole.

Figure 11B:
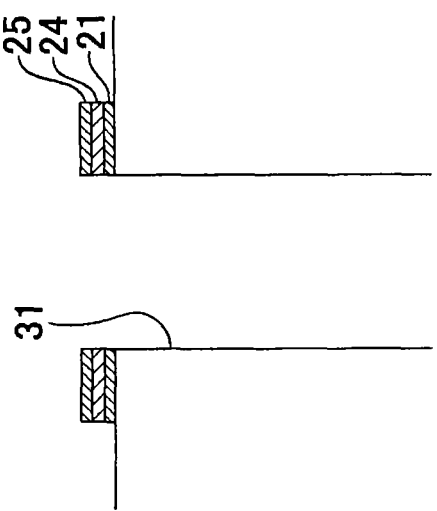

FIG. 11(B) shows a through-hole land and part of a through-hole conductor. The through-hole land shown in FIG. 11(B) is first through-hole land (TL1). The second through-hole land has the same structure as that of the first through-hole land. As shown in FIG. 11(B), the first through-hole land includes metal foil 21 on the first insulation layer, first electroless plated film 24 on the metal foil, first electrolytic plated film 25 on the first electroless plated film, second electroless plated film (17a) on the first electrolytic plated film, and second electrolytic plated film (17b) on the second electroless plated film. In addition, the through-hole conductor is formed with second electroless plated film (17a) and second electrolytic plated film (17b) on the second electroless plated film, which are in contact with a side wall of metal foil 21, a side wall of first electroless plated film 24 and a side wall of first electrolytic plated film 25. The first electroless plated film and the first electrolytic plated film do not extend into the through-hole conductor, but are in contact with the side wall of the through-hole conductor. The second electroless plated film and the second electrolytic plated film of the through-hole conductor extend onto the through-hole land.

The second conductive layer of the multilayer core substrate has a second through-hole land. The second through-hole land includes a metal foil under the second insulation layer, a first electroless plated film under the metal foil, a first electrolytic plated film under the first electroless plated film, a second electroless plated film under the first electrolytic plated film, and a second electrolytic plated film under the second electroless plated film.

Since the core substrate of the present embodiment is a multilayer core substrate, a penetrating hole for a through-hole conductor is long. Thus, greater stress is exerted on the through-hole conductor during a heat cycle. In addition, the multilayer core substrate of the present embodiment is formed with multiple insulation layers, and a via conductor (outermost via conductor of the multilayer core substrate) is formed in an outermost insulation layer of the multiple insulation layers (outermost insulation layer of the multilayer core substrate). The first insulation layer of the multilayer core substrate is the uppermost as well as outermost insulation layer, and the second insulation layer is the lowermost as well as outermost insulation layer.

The outermost via conductor of the multilayer core substrate is formed between through-hole conductors. Thus, when the multilayer core substrate of the present embodiment deforms, the deformation tends to be more complex than that of a multilayer core substrate without an outermost via conductor. However, a through-hole land of the present embodiment includes multiple electroless plated films and multiple electrolytic plated films, and the electroless plated films and the electrolytic plated films are alternately laminated. Accordingly, the rigidity around the through-hole conductor is high. In addition, the through-hole conductor is in contact with side walls of the plated films of the through-hole land, thereby increasing the contact area between the through-hole conductor and the through-hole land. Therefore, according to a multilayer core substrate of the present embodiment, the reliability of the through-hole conductor is high.

By contrast, when a through-hole land is formed with a single-layer electroless copper-plated film and a single-layer electrolytic copper-plated film and when a through-hole conductor extends onto the surface of the core substrate and is not in contact with side walls of the plated films of the through-hole land, the reliability of the through-hole conductor is thought to be lowered by a heat cycle.

The first conductive layer of the multilayer core substrate in the present embodiment includes a first via land, which is formed on the first insulation layer. The first via land is directly connected to via conductor (38C) formed in the first insulation layer (first outermost via conductor of the multilayer core substrate) and is formed around first outermost via conductor (38C). The first insulation layer has opening 23 for a first outermost via conductor of the multilayer core substrate. The first outermost via conductor is made up of a first electroless plated film and a first electrolytic plated film on the first electroless plated film that are formed in opening 23. Opening 23 is substantially filled with the first electrolytic plated film. The first via land is made of the metal foil on the first insulation layer, the first electroless plated film on the metal foil and the first electrolytic plated film on the first electroless plated film. The first outermost via conductor and first via land are covered by the second electroless plated film. The second electrolytic plated film on the second electroless plated film is further formed on the first outermost via conductor and first via land.

The fourth conductive layer of the multilayer core substrate has a second via land, which is formed under the second insulation layer. In addition, the second via land is directly connected to via conductor (38D) in the second insulation layer (second outermost via conductor of the multilayer core substrate), and is formed around the second outermost via conductor.

The second insulation layer has opening 23 for a second outermost via conductor of the multilayer core substrate. The second outermost via conductor is made up of a first electroless plated film and a first electrolytic plated film under the first electroless plated film that are formed in opening 23. Opening 23 is substantially filled with the first electrolytic plated film. The second via land is made of the metal foil under the second insulation layer, the first electroless plated film under the metal foil and the first electrolytic plated film under the first electroless plated film. The second outermost via conductor and the second via land are covered by a second electroless plated film. A second electrolytic plated film under the second electroless plated film is further formed under the second outermost via conductor and the second via land.

The first and second via lands of the multilayer core substrate have the metal foil, the first electroless plated film, first electrolytic plated film, second electroless plated film and second electrolytic plated film. The first and second via lands have multiple electroless plated films and multiple electrolytic plated films. Compared to a via land formed with a single-layer electroless copper-plated film and a single-layer electrolytic copper-plated film, connection reliability is improved in the present embodiment between an outermost via conductor of the multilayer core substrate and the via land connected to the via conductor.

A through-hole land and a via land in the aforementioned multilayer core substrate include a metal foil. However, the first electroless plated film may also be formed on the outermost insulation layer of the multilayer core substrate without a metal foil disposed in between. In such a case, the aforementioned through-hole land and via land are formed with a first electroless plated film, a first electrolytic plated film on the first electroless plated film, a second electroless plated film on the first electrolytic plated film, and a second electrolytic plated film on the second electroless plated film.

Filler (resin filler) (33a) containing resin and inorganic particles is filled in a cylindrical through-hole conductor. Covering circuit 330 is formed on filler (33a) and the through-hole land. Covering circuit 330 covers filler (33a). The covering circuit on the first insulation layer is first covering circuit (33af), and the covering circuit under the second insulation layer is second covering circuit (33as). The first covering circuit is included in the first conductive layer and the second covering circuit is included in the fourth conductive layer.

First covering circuit (33af) is made of third electroless plated film (18a) and third electrolytic plated film (18b) on the third electroless plated film. The third electroless plated film of the first covering circuit is formed on the second electrolytic plated film.

Second covering circuit (33as) is made of a third electroless plated film and a third electrolytic plated film on the third electroless plated film. The third electroless plated film of the second covering circuit is formed under the second electrolytic plated film.

The third electroless plated film and the third electrolytic plated film of the first covering circuit are formed on the first via land and the first outermost via conductor of the multilayer core substrate. The third electroless plated film of the first covering circuit is formed on the second electrolytic plated film.

The third electroless plated film and the third electrolytic plated film of the second covering circuit are formed under the second via land and the second outermost via conductor of the multilayer core substrate. The third electroless plated film of the second covering circuit is formed under the second electrolytic plated film.

Other than a via land and a through-hole land, the fourth conductive layer includes a fourth conductive circuit. The fourth conductive circuit is made up of the metal foil, the first electroless plated film on the metal foil, the first electrolytic plated film on the first electroless plated film, the second electroless plated film on the first electrolytic plated film, the second electrolytic plated film on the second electroless plated film, the third electroless plated film on the second electrolytic plated film, and the third electrolytic plated film on the third electroless plated film.

Other than a via land and a through-hole land, the fourth conductive layer includes a fourth conductive circuit. The fourth conductive circuit is made up of the metal foil, the first electroless plated film under the metal foil, the first electrolytic plated film under the first electroless plated film, the second electroless plated film under the first electrolytic plated film, the second electrolytic plated film under the second electroless plated film, the third electroless plated film under the second electrolytic plated film, and the third electrolytic plated film under the third electroless plated film. Since conductive circuits include three-layered electroless plated film and three-layered electrolytic plated film, the conductive circuits have lower resistance. The first conductive circuit and the second conductive circuit are preferred to be plain layers and to function as a power-source layer or a ground layer. Stable power will be supplied to an IC chip.

The first and fourth conductive circuits in the multilayer core substrate include a metal foil. However, it is also an option to form a first electroless plated film on an outermost insulation layer of the multilayer core substrate without a metal foil disposed in between. In such a case, the first and fourth conductive circuits in the multilayer core substrate are made of a first electroless plated film, a first electrolytic plated film on the first electroless plated film, a second electroless plated film on the first electrolytic plated film, a second electrolytic plated film on the second electroless plated film, a third electroless plated film on the second electrolytic plated film, and a third electrolytic plated film on the third electroless plated film.

The insulation layers other than an outermost insulation layer of the multilayer core substrate are preferred to contain reinforcement material such as glass cloth, and the outermost insulation layer is preferred not to contain reinforcement material such as glass cloth. However, each insulation layer in the multilayer core substrate contains inorganic particles such as silica. Since an outermost insulation layer of the multilayer core substrate does not contain reinforcement material, the outermost insulation layer has less strength. Thus, greater stress is exerted between a through-hole conductor and the through-hole land and between a via conductor and the via land. However, since the through-hole land and via land of the present embodiment include multiple electroless plated films and multiple electrolytic plated films, disconnection is unlikely to occur between a through-hole conductor and the through-hole land and between a via conductor and the via land.

In addition, the diameter of a via conductor in an outermost insulation layer of the multilayer core substrate is made smaller, which reduces the size of the printed wiring board. Therefore, stress decreases and the reliability of the multilayer core substrate increases.

The multilayer core substrate may include another insulation layer and another conductive layer between the first insulation layer and the double-sided board. The multilayer core substrate may include another insulation layer and another conductive layer between the second insulation layer and the double-sided board.

An upper buildup layer is formed on the first insulation layer and first conductive layer (34C) of multilayer core substrate 30. The upper buildup layer has upper interlayer resin insulation layer (50A) formed on the first main surface of the multilayer core substrate, upper conductive layer (58A) on upper interlayer resin insulation layer (50A), and upper via conductor (60A) which penetrates through the upper interlayer resin insulation layer and connects upper conductive layer (58A) and first conductive layer (34C).

The upper buildup layer also has uppermost interlayer resin insulation layer (50C) formed on upper interlayer resin insulation layer (50A) and upper conductive layer (58A), uppermost conductive layer (58C) formed on uppermost interlayer resin insulation layer (50C), and uppermost via conductor (60C) which penetrates through the uppermost interlayer resin insulation layer and connects the upper conductive layer and uppermost conductive layer. The upper buildup layer may also include another interlayer resin insulation layer and another conductive layer between the upper interlayer resin insulation layer and the uppermost interlayer resin insulation layer.

A lower buildup layer is formed under the second insulation layer and fourth conductive layer (34D) of the multilayer core substrate. The lower buildup layer has lower interlayer resin insulation layer (50B), lower conductive layer (58B) formed under lower interlayer resin insulation layer (50B), and lower via conductor (60B) which penetrates through lower interlayer resin insulation layer (50B) and connects lower conductive layer (58B) and fourth conductive layer (34D).

The lower buildup layer also has lowermost interlayer resin insulation layer (50D) formed under the lower interlayer resin insulation layer and the lower conductive layer, lowermost conductive layer (58D) formed under the lowermost interlayer resin insulation layer, and lowermost via conductor (60D) which penetrates through lowermost interlayer resin insulation layer (50D) and connects the lowermost conductive layer and the lower conductive layer. The lower buildup layer may also include another interlayer resin insulation layer and another conductive layer between the lower interlayer resin insulation layer and the lowermost interlayer resin insulation layer.

Upper solder-resist layer (70F) is formed on uppermost interlayer resin insulation layer (50C) and the uppermost conductive layer, and lower solder-resist layer (70S) is formed under lowermost interlayer resin insulation layer (50D) and the lowermost conductive layer. Solder-resist layers (70F, 70S) have openings (71F, 71S) exposing at least part of uppermost conductive layer (58C) and lowermost conductive layer (58D) respectively. Solder bumps (76F, 76S) are respectively formed in openings (71F, 71S). In the first and second embodiments, first and fourth conductive layers are formed with three-layered electroless plated film and three-layered electrolytic plated film. Accordingly, the top surface of a via conductor and the top surface of a conductive circuit are likely to be positioned on the same plane.

Second Embodiment

Figure 12A:
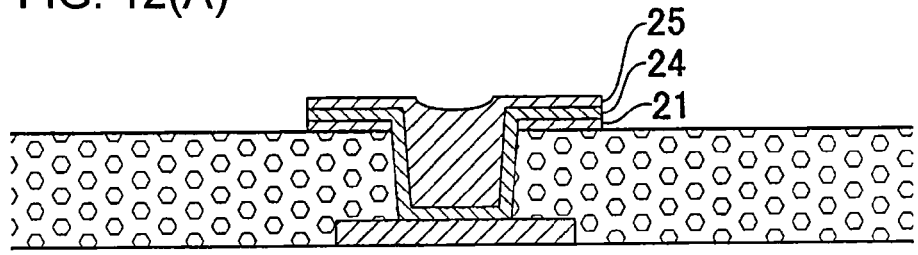
FIG. 12(A)-12(D) show views of processing steps of a method for manufacturing a printed wiring board according to the second embodiment.

Even if first electrolytic plated film 25 of an outermost via conductor in a multilayer core substrate has a recess as shown in FIG. 12(A), a second electroless plated film is formed directly on the first electrolytic plated film, and a second electrolytic plated film is directly on the second electroless plated film in the aforementioned first embodiment. Then, a third electroless plated film is directly formed on the second electrolytic plated film, and a third electrolytic film is directly formed on the third electroless plated film.

Figure 12B:
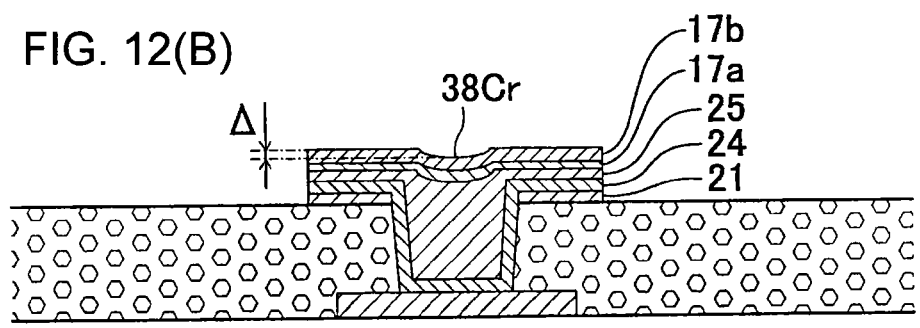

Even if second electrolytic plated film (17b) of an outermost via conductor in a multilayer core substrate has a recess as shown in FIG. 12(B), a second electroless plated film is formed directly on a first electrolytic plated film, a second electrolytic plated film is formed directly on the second electroless plated film, a third electroless plated film is formed directly on the second electrolytic plated film, and a third electrolytic plated film is formed directly on the third electroless plated film in the aforementioned first embodiment.

Figure 12C:
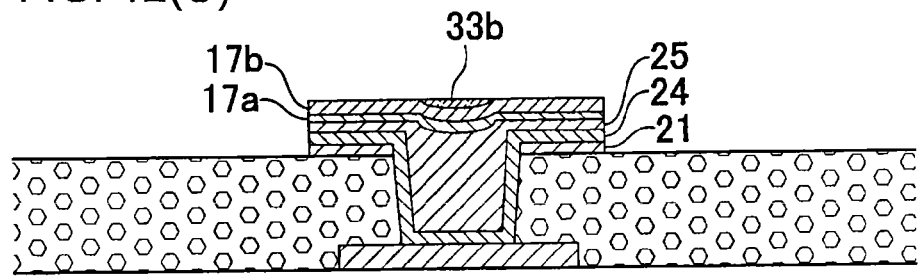
Figure 12D:
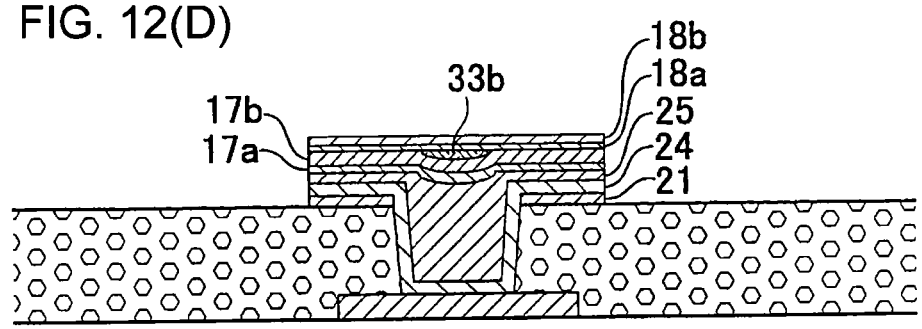

By contrast, in a second embodiment, when a second electrolytic plated film on an outermost via conductor in a multilayer core substrate has a recess as shown in FIG. 12(B), filler (33b) made of the same material as a filler (resin filler) that fills the space inside a through-hole conductor is filled in the recess (FIG. 12(C)). Then, third electroless plated film (18a) and third electrolytic plated film (18b) are formed on the filler (FIG. 12(D)). The filler makes the plated film flat on an outermost via conductor in the multilayer core substrate. Undulation or warping is smaller on the upper and lower buildup layers. Depth (A) of the recess is preferred to be 7 µm or less, since peeling is less likely to occur between the land of an outermost via conductor and the second electroless plated film in the multilayer core substrate.

In the second embodiment, even if outermost via conductors (38C, 38D) in the multilayer core substrate have a recess, surfaces of the outermost via conductors are made flat by the filler. Accordingly, the top surface of a via conductor and the top surface of a conductive circuit are likely to be positioned on the same plane, allowing fine conductive circuits to be formed on buildup layers on the multilayer core substrate.

When the first and second conductive layers are set thicker, stable power is supplied to an IC chip mounted on the printed wiring board. When first and fourth conductive layers with the same thickness are formed using a method according to an embodiment of the present invention, the first and fourth conductive layers include more plated films. Since plating is performed multiple times in the embodiments, the thicknesses of conductive circuits included in the first and fourth conductive layers show smaller variations. Thus, when an IC chip is mounted on a printed wiring board according to the embodiments, the IC chip is unlikely to malfunction.

Figure 8:
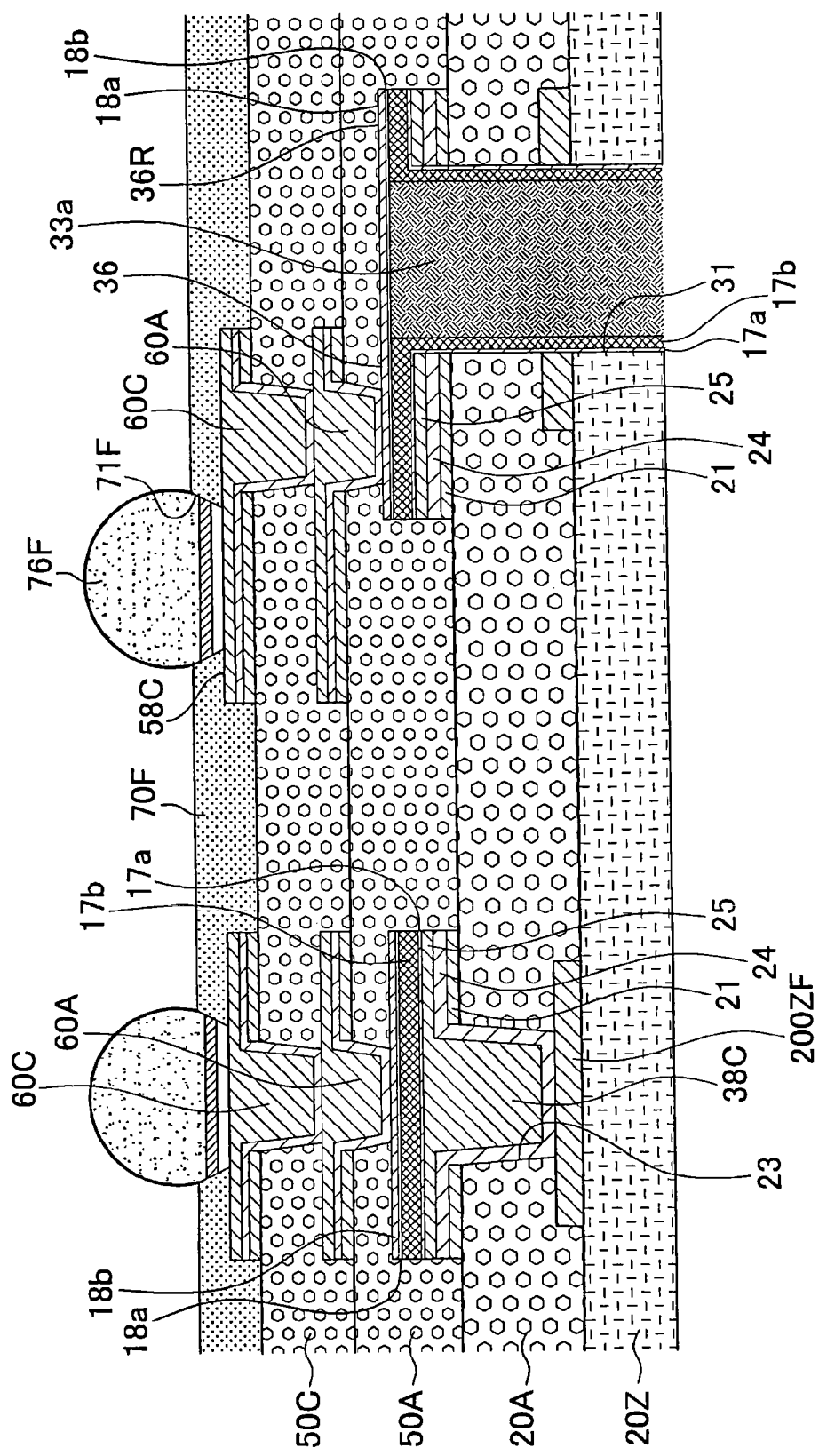
FIG. 8 is a cross-sectional view showing part of the multilayer core substrate and upper buildup layer of a printed wiring board according to the first embodiment.

FIG. 8 shows part of a printed wiring board according to the first or second embodiment. Filler (33*b*) is omitted in the drawing.

As shown in FIG. 8, uppermost and upper via conductors (60A, 60C) in the upper buildup layer are stacked on first outermost via conductor (38C). A so-called stacked-via structure is formed on the first outermost via conductor. Also, uppermost and upper via conductors (60A, 60C) in the upper buildup layer are stacked on the covering circuit, which covers a through-hole land and filler. A so-called stacked-via structure is formed on the covering circuit. A stacked-via structure is preferred to be formed on the covering circuit that covers a through-hole land. According to the embodiments, a stacked-via structure is formed on the plated film that includes three-layered electroless plated film and three-layered electrolytic plated film. Such plated film is preferred to be formed on a metal foil. Since a stacked-via structure is formed on a conductor of great strength, the reliability of the stacked-via structure is high. Even if a stacked-via structure includes four or more via conductors, the reliability of the stacked-via structure is high. Even if four or more via conductors are stacked, the reliability is high.

Manufacturing Method

A method for manufacturing printed wiring board 10 of the first embodiment is shown in FIG. 2 through FIG. 6.

(1) First, double-sided board (200*z*) is prepared, being formed with insulation layer (20Z) containing a reinforcement material and resin, and with conductive layers (200ZF, 200ZS) which are formed on both surfaces of insulation layer (20Z) and include multiple conductive circuits (FIG. 2(A)). Glass cloth, aramid fiber, fiber glass and the like are used as reinforcement material. Glass cloth is preferred. As for resin, epoxy resin, BT (bismaleimide triazine) resin and the like may be used.

(2) Copper foils (21, 21) are laminated on both surfaces of double-sided board (200*z*) with insulation layers (interlayer resin insulation film (brand name: ABF-45SH, made by Ajinomoto) disposed in between. Then, hot pressing is performed to obtain intermediate substrate 300 made up of first insulation layer (20A), second insulation layer (20B), the double-sided board between first insulation layer (20A) and second insulation layer (20B), metal foil (copper foil) 21 on the first insulation layer and metal foil (copper foil) 21 under the second insulation layer (FIG. 2(B)). First insulation layer (20A) has a first surface and a second surface opposite the first surface, and copper foil 21 is formed on the first surface of the first insulation layer. Second insulation layer (20B) has a third surface and a fourth surface opposite the third surface, and copper foil 21 is formed under the fourth surface of the second insulation layer. The double-sided board is formed between the second surface of the first insulation layer and the third surface of the second insulation layer. The double-sided board is sandwiched between the second surface of the first insulation layer and the third surface of the second insulation layer. The first and second insulation layers may contain reinforcement material.

(3) Using a CO2 laser, via-conductor opening 23 which reaches conductive layer (200ZF) is formed in first insulation layer (20A). Also, using the CO2 laser, via-conductor opening 23 which reaches conductive layer (200ZS) is formed in second insulation layer (20B) (FIG. 2(C)).

(4) First electroless plated film 24 is formed on the surfaces of intermediate substrate 300 having via-conductor openings and on the inner walls of via-conductor openings (23, 23) (FIG. 2(D)).

(5) Using the first electroless plated film as a seed layer, first electrolytic plated films (25, 25) are formed on first electroless plated films (24, 24). Openings (23, 23) are substantially filled with the first electrolytic plated film. Filled via conductors (38C, 38D) are formed in openings (23, 23) (FIG. 2(E)). First conductive film 16 is made up of a first electroless plated film and a first electrolytic plated film.

Figure 3A:
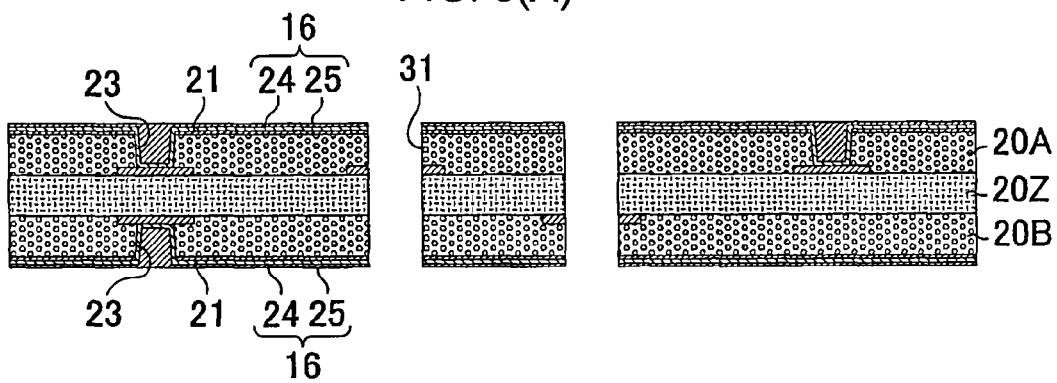
FIG. 3(A)-3(C) show views of processing steps of the method for manufacturing a printed wiring board according to the first embodiment.
Figure 3B:
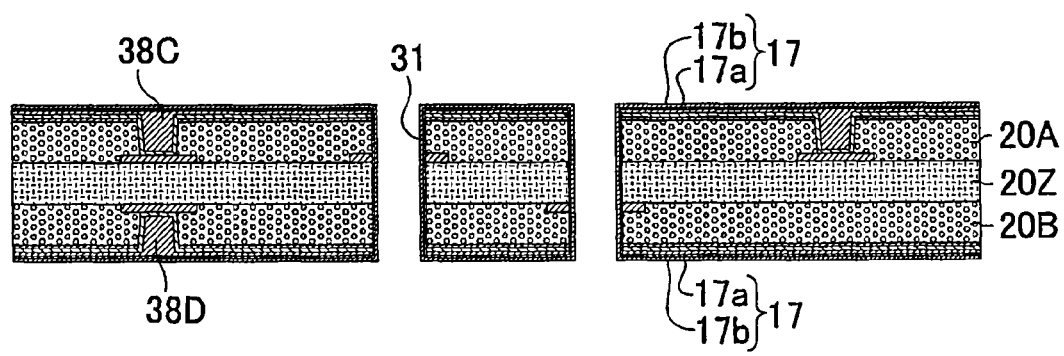

(6) Using a drill, penetrating hole 31 for a through-hole conductor is formed in intermediate substrate 300 having via conductors (38C, 38D) (FIG. 3(A)). As shown in FIG. 11(A), penetrating hole 31 for a through-hole conductor exposes side walls of metal foil 21 such as copper foil, first electroless plated film 24 on the copper foil, and first electrolytic plated film 25 on the first electroless plated film.

(7) Second electroless plated film (17*a*) is formed on the surfaces of the intermediate substrate having via conductors (38C, 38D), and on the inner wall of penetrating hole 31 for a through-hole conductor. Second electrolytic plated film (17*b*) is further formed on second electroless plated film (17*a*), forming second conductive film 17 made up of a second electroless plated film and a second electrolytic plated film (FIG. 3(B)). A through-hole conductor is formed with the second electroless plated film and the second electrolytic plated film on the second electroless plated film. At that time, second electroless plated film (17*a*) is formed on the side wall of metal foil 21, the side wall of first electroless plated film 24 and the side wall of first electrolytic plated film 25 that are exposed by penetrating hole 31 as shown in FIG. 11(B). Second electrolytic plated film (17*b*) is also formed on the side wall of the metal foil, the side wall of the first electroless plated film, and the side wall of the first electrolytic plated film with second electroless plated film (17*a*) disposed in between. Through-hole conductor 36 is formed on the side walls of insulation layers of the multilayer core substrate, the side walls of metal foils (21, 21) and the side wall of first conductive film 16 that are exposed by penetrating hole 31.

Figure 3C:
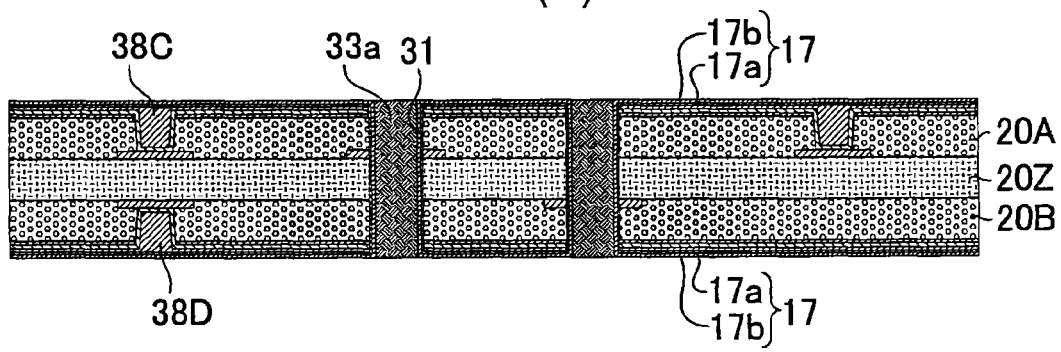

(8) Resin filler (33*a*) is filled in a cylindrical through-hole conductor (FIG. 3(C)). The resin filler contains inorganic particles such as silica and resin such as epoxy.

(9) Third electroless plated film (18*a*) is formed on the second electrolytic plated film and resin filler (33*a*). Next, third electrolytic plated film (18*b*) is formed on the third electroless plated film (FIG. 4(A)). Third conductive film 18 is made up of the third electroless plated film and the third electrolytic plated film.

Figure 4A:
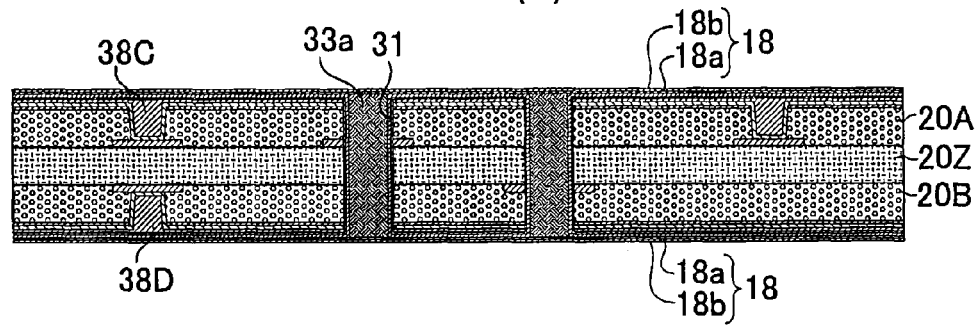
FIG. 4(A)-4(D) show views of processing steps of the method for manufacturing a printed wiring board according to the first embodiment.
Figure 4B:
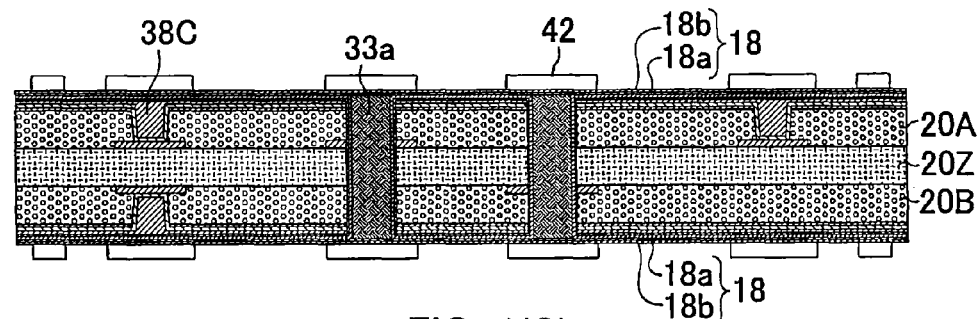

(10) Etching resist 42 is formed on third conductive film 18 (FIG. 4(B)).

(11) Third conductive film 18, second conductive film 17, first conductive film 16 and metal foil 21 which are exposed from etching resist 42 are removed. Then, etching resist 42 is removed. Accordingly, first conductive layer (34C) is formed on the first insulation layer, and fourth conductive layer (34D) is formed under the second insulation layer. Also, outermost via conductors and through-hole conductors are formed. Multilayer core substrate 30 is completed (FIG. 4(C)).

Figure 4C:
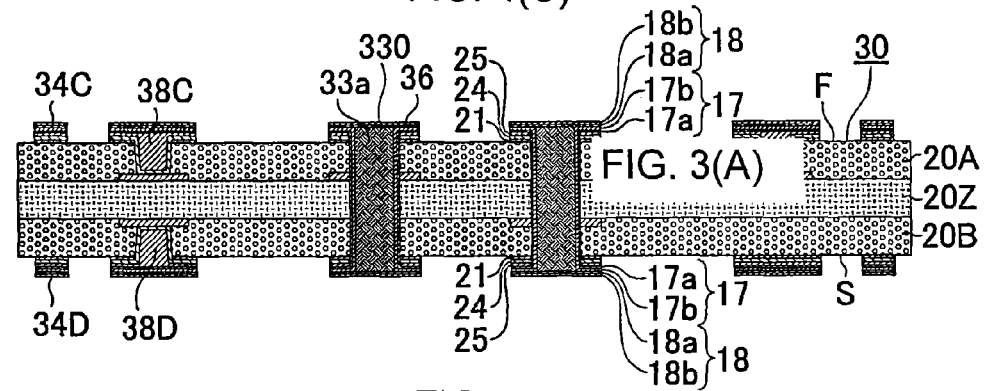

The multilayer core substrate shown in FIG. 4(C) has four conductive layers. The conductive layer on the first-insulation-layer side of the double-sided board is an upper conductive layer, and the conductive layer on the second-insulation-layer side of the double-sided board is a lower conductive layer. The upper conductive layer is formed under the second surface of the first insulation layer, and the lower conductive layer is formed on the third surface of the second insulation layer.

In FIG. 4(C), outermost via conductors of the multilayer core substrate are formed with the first conductive film, and through-hole conductors are formed with the second conductive film. The via conductors and the through-hole conductors are formed with different plated films.

In FIG. 4(C), the land of an outermost via conductor of the multilayer core substrate is formed with a metal foil and a first conductive film on the metal film. Then, a second conductive film is formed directly on the outermost via conductor and the land of the via conductor, and a third conductive film is further formed directly on the second conductive film.

In FIG. 4(C), the land of a through-hole conductor of the multilayer core substrate is formed with a metal foil, a first conductive film on the metal foil, and a second conductive film on the first conductive film. Then, a third conductive film is formed directly on the land of the through-hole conductor.

In FIG. 4(C), conductive circuits included in the first and fourth conductive layers are formed with a metal foil, a first conductive film on the metal foil, a second conductive film on the first conductive film, and a third conductive film on the second conductive film. It is an option to eliminate the metal foil from the first and fourth conductive layers.

Figure 4D:
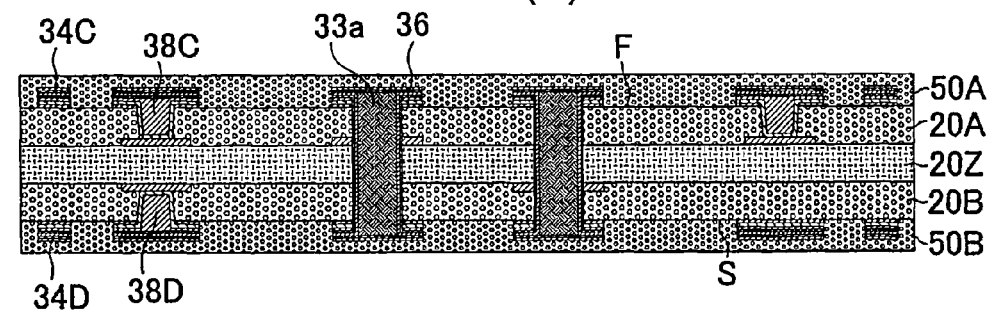

(12) Upper and lower interlayer resin insulation layers (50A, 50B) are respectively formed on both surfaces of multilayer core substrate 30 (FIG. 4(D)).

Figure 5A:
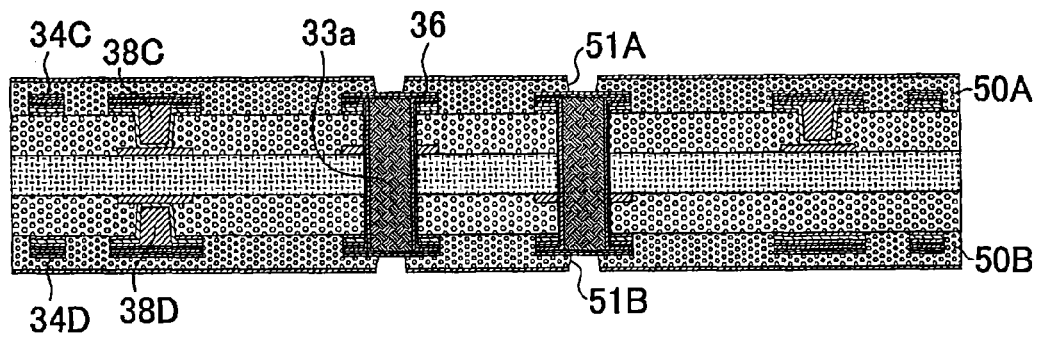
FIG. 5(A)-5(C) show views of processing steps of the method for manufacturing a printed wiring board according to the first embodiment.

(13) Next, using a CO2 gas laser, upper and lower via-conductor openings (51A, 51B) are respectively formed in interlayer resin insulation layers (50A, 50B) (FIG. 5(A)).

Figure 5B:
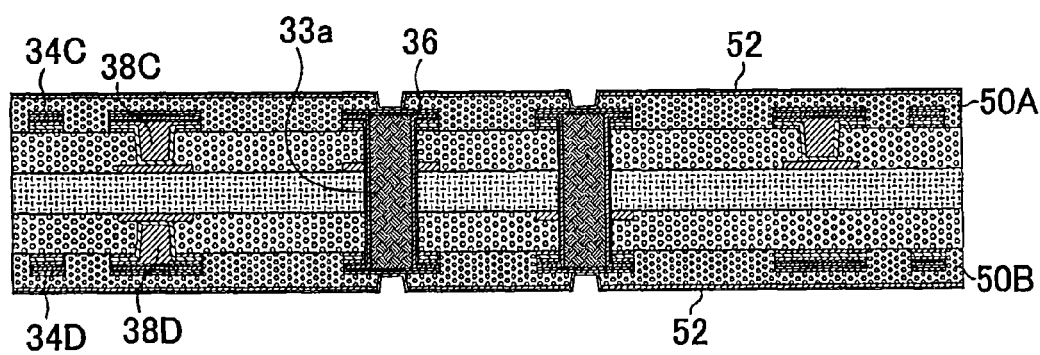

(14) Electroless plated films (52, 52) are formed on the surfaces of lower and upper interlayer resin insulation layers (50A, 50B) and on the inner walls of openings (51A, 51B) (FIG. 5(B)).

Figure 5C:
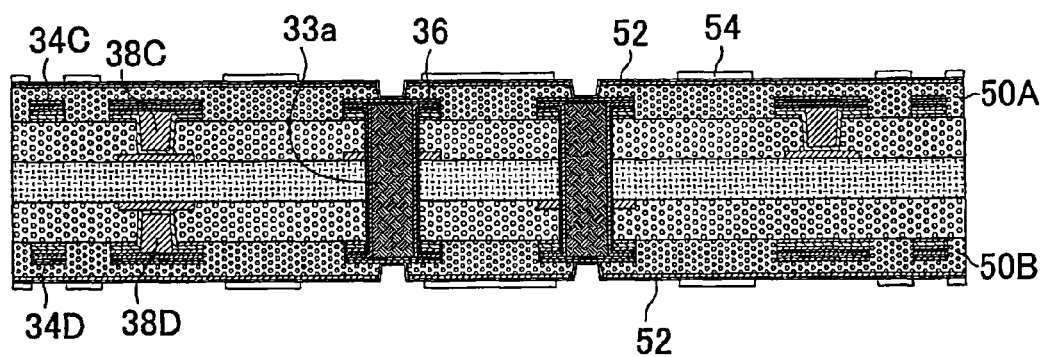

(15) Plating resist 54 is formed on electroless plated film 52 (FIG. 5(C)).

Figure 6A:
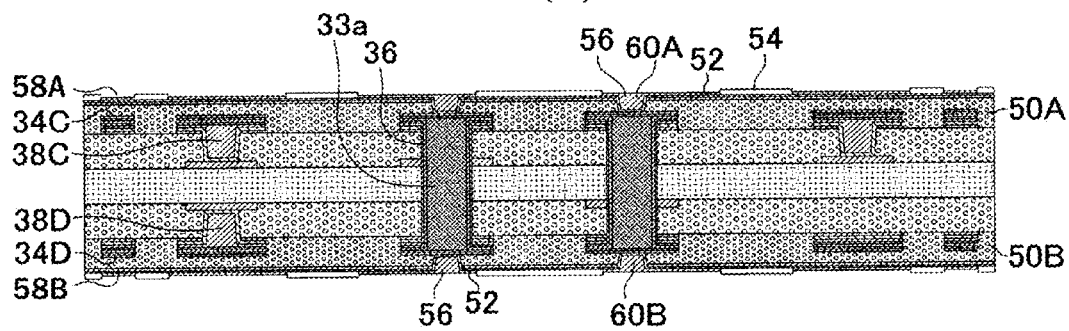
FIG. 6(A)-6(C) show views of processing steps of the method for manufacturing a printed wiring board according to the first embodiment.
Figure 6B:
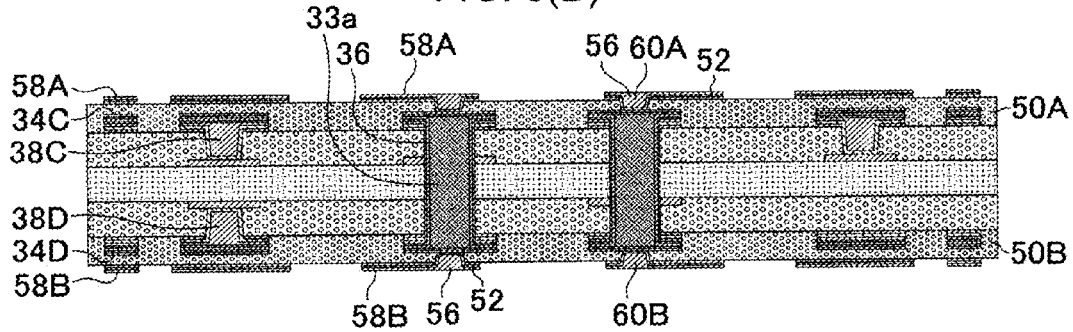
Figure 6C:
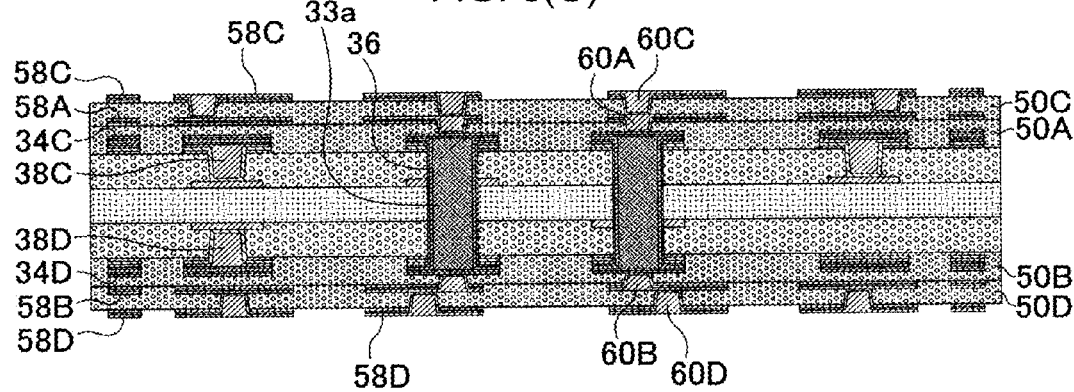

(16) Electrolytic plated film 56 is formed on electroless plated film 52 exposed from plating resist 54 (FIG. 6(A)).

(17) Plating resist 54 is removed. Electroless plated film 52 between portions of the electrolytic plated film is etched away. Upper and lower conductive layers (58A, 58B) and upper and lower via conductors (60A, 60B) are formed (FIG. 6(B)).

(18) Next, steps in (12) through (17) above are repeated to form uppermost and lowermost interlayer resin insulation layers (50C, 50D). Uppermost conductive layer (58C) is formed on uppermost interlayer resin insulation layer (50C), and lowermost conductive layer (58D) is formed under lowermost interlayer resin insulation layer (50C). Uppermost via conductor (60C) is formed in uppermost interlayer resin insulation layer (50C) to connect the upper conductive layer and uppermost conductive layer. Lowermost via conductor (60D) is formed in lowermost interlayer resin insulation layer (50D) to connect the lower conductive layer and lowermost conductive layer. Upper and lower buildup layers are completed.

Figure 7A:
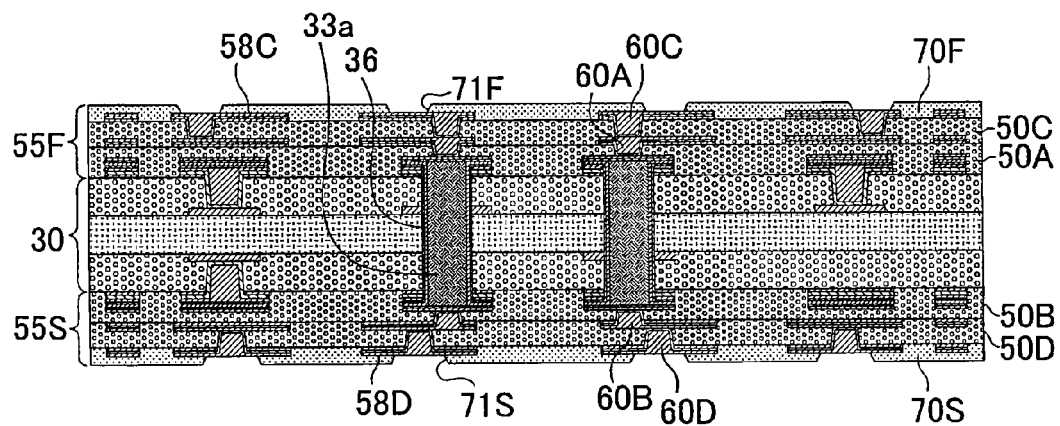
FIG. 7(A)-7(B) show views of processing steps of the method for manufacturing a printed wiring board according to the first embodiment.

(19) Upper solder-resist layer (70F) with opening (71F) is formed on the upper buildup layer, and lower solder-resist layer (70S) with opening (71S) is formed under the lower buildup layer (FIG. 7(A)). Uppermost conductive layer (58C) and lowermost conductive layer (58D) respectively exposed through openings (71F, 71S) work as solder pads.

Figure 7B:
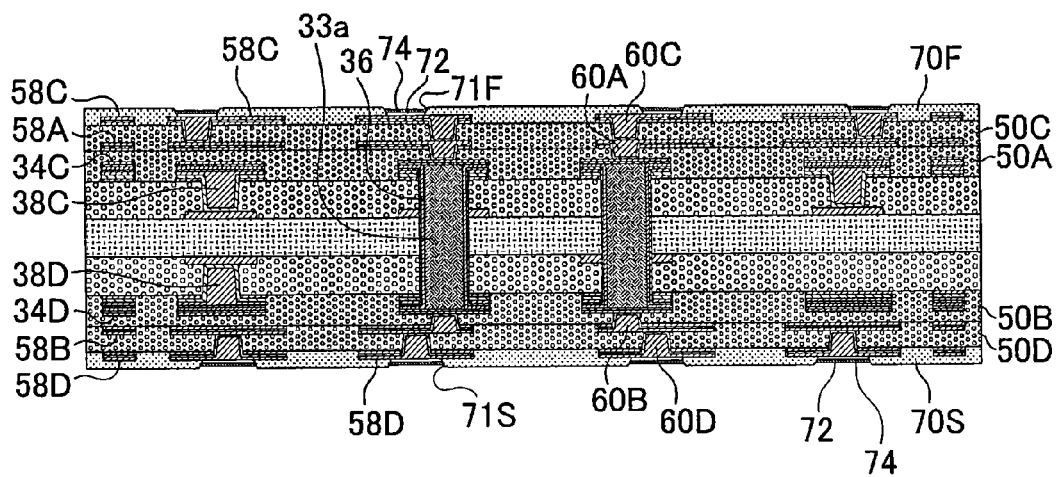

(20) Nickel-plated layer 72 is formed on solder pads, and gold-plated layer 74 is further formed on nickel-plated layer 72 (FIG. 7(B)).

(21) Solder balls are mounted in openings (71F, 71S) and a reflow is conducted so that solder bump (76F) is formed on a solder pad of the upper buildup layer and solder bump (76S) is formed under a solder pad of the lower buildup layer. Printed wiring board 10 is completed (FIG. 1). Electroless copper-plated film is preferred for the electroless plated film, and electrolytic copper-plated film is preferred for the electrolytic plated film.

Manufacturing Method of the Second Embodiment

When an outermost via conductor is formed in a multilayer core substrate, the duration for forming a first electrolytic plated film is shorter. Thus, a recess is formed on the top surface of the first conductive film of the outermost via conductor. As an effect of that recess, recess (38Cr) is formed on the top surface of the second conductive film on outermost via conductor (38C) (FIG. 12(B)). Filler (33b) is filled in recess (38Cr) of the second conductive film (FIG. 12(C)). Next, a third conductive film is formed on fillers (33a, 33b) and on the second electrolytic film (FIG. 12(D)).

After the third conductive film is formed, a printed wiring board of the second embodiment is formed according to the same method as in the first embodiment. The multilayer core substrate may also include another insulation layer and another conductive layer between the double-sided board and an outermost insulation layer of the multilayer core substrate.

With a greater length of a through-hole conductor that penetrates through a multilayer core substrate, it is thought that disconnection or peeling tends to occur in the through-hole conductor due to a heat cycle. Especially, when the number of insulation layers of the multilayer core substrate is five or more, disconnection or peeling is likely to occur. Also, when the thickness of the multilayer core substrate is 0.8 mm or greater, disconnection or peeling is likely to occur.

Figure 9:
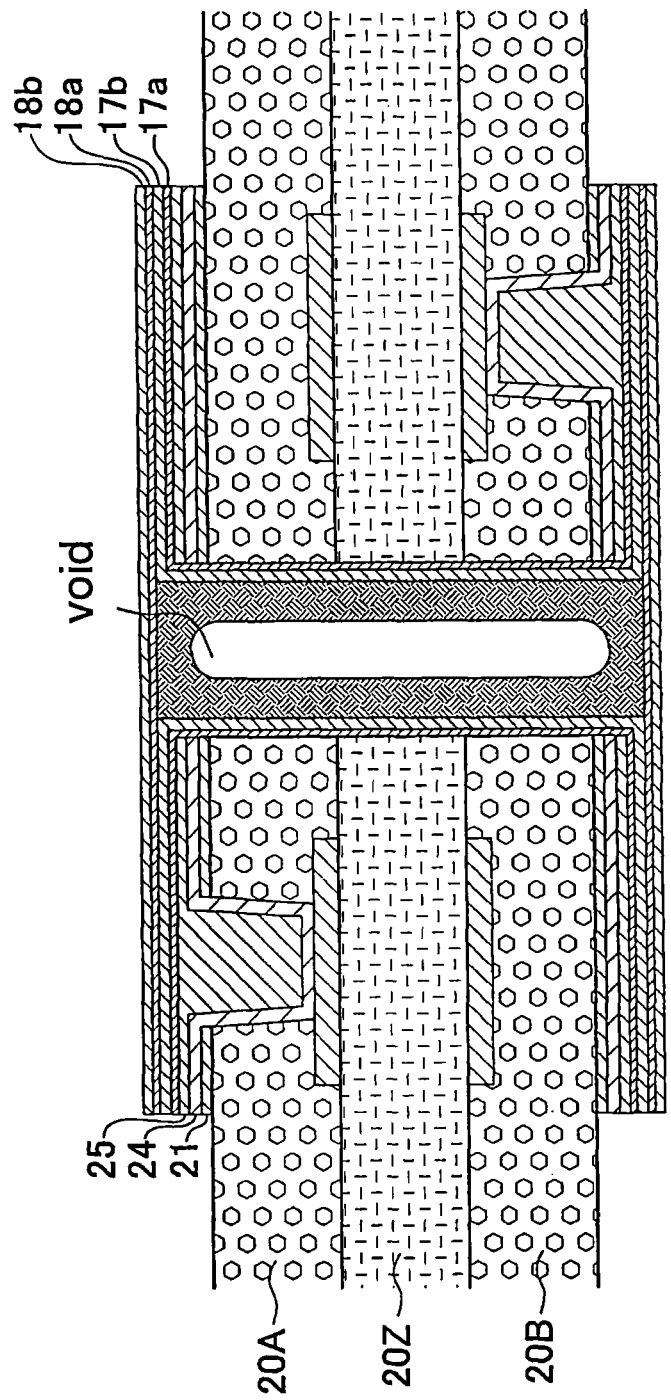
FIG. 9 is a cross-sectional view showing a potential defect.
Figure 10:
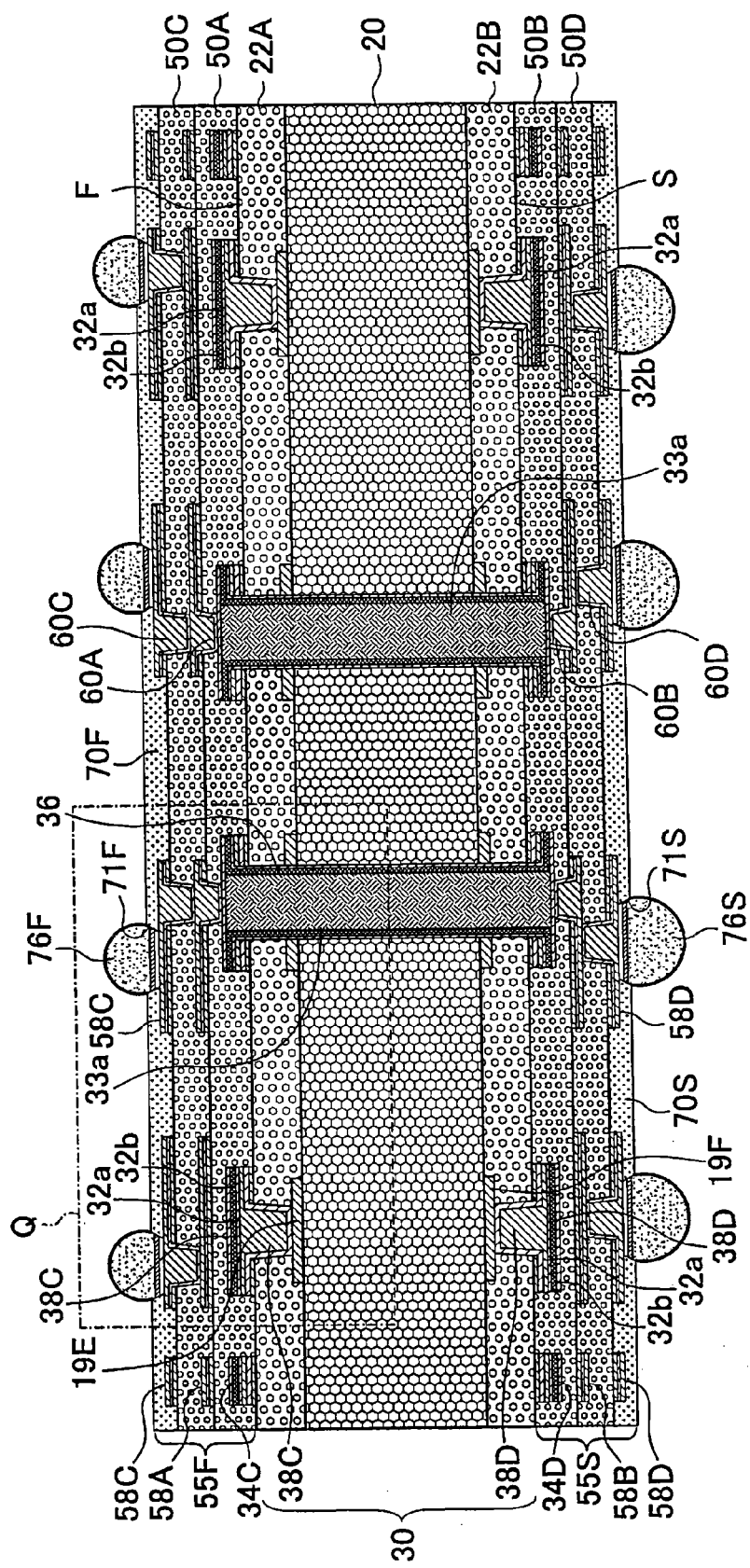
FIG. 10 is a cross-sectional view of a printed wiring board according to a second embodiment of the present invention.

When a through-hole conductor and a via conductor of a multilayer core substrate are simultaneously formed and when the via-conductor opening is filled with plating, both ends of the through-hole conductor opening tend to be covered with the plating, as shown in FIG. 9. In that situation, a void is thought to be present inside the through-hole conductor. Disconnection of the through-hole conductor is thought to occur due to the void.

When the plated film of a through-hole conductor is made thinner to prevent a void shown in FIG. 9, the via conductor has a larger recessed portion. In such a case, it is difficult to form a buildup layer on the multilayer core substrate. A printed wiring board according to an embodiment of the present invention shown in FIG. 1 and the others solves the above problems.

A multilayer core substrate according to an embodiment of the present invention exhibits excellent connection reliability, and a printed wiring board according to an embodiment of the present invention has the multilayer core substrate. Another embodiment of the present invention is directed to a method for manufacturing such a printed wiring board.

A printed wiring board according to an embodiment of the present invention has a multilayer core substrate that includes the following: a first insulation layer having a first surface and a second surface opposite the first surface; a second insulation layer having a third surface and a fourth surface opposite the third surface; a double-sided board positioned between the second surface of the first insulation layer and the third surface of the second insulation layer; a first conductive layer formed on the first surface of the first insulation layer; a second conductive layer formed under the second surface of the first insulation layer; a third conductive layer formed on the third surface of the second insulation layer; a fourth conductive layer formed under the fourth surface of the second insulation layer; a cylindrical through-hole conductor formed on the side wall of a penetrating hole for a through-hole conductor which penetrates through the first insulation layer, the double-sided board and the second insulation layer, and which connects the first conductive layer and the fourth conductive layer; a first via conductor penetrating through the first insulation layer and connecting the first conductive layer and the second conductive layer; a resin filler filled in the cylindrical through-hole conductor; and a covering circuit formed to cover the resin filler. The printed wiring board has the multilayer core substrate and an upper buildup layer formed on the first insulation layer and the first conductive layer as well as a lower buildup layer formed under the second insulation layer and the fourth conductive layer.

In addition, the first conductive layer has a first through-hole land formed around the through-hole conductor and directly connected to the through-hole conductor; the first through-hole land is formed with a metal foil, a first electroless plated film on the metal foil, a first electrolytic plated film on the first electroless plated film, a second electroless plated film on the first electrolytic plated film, and a second electrolytic plated film on the second electroless plated film; the through-hole conductor is formed with the second electroless plated film and the second electrolytic plated film on the second electroless plated film; and the second electroless plated film of the through-hole conductor is formed on the side wall of the metal foil, the side wall of the first electroless plated film, and the side wall of the first electrolytic plated film that are exposed by the penetrating hole for a through-hole conductor.

A method for manufacturing a multilayer core substrate according to an embodiment of the present invention includes the following: preparing an intermediate substrate that has a first insulation layer having a first surface and a second surface opposite the first surface, a second insulation layer having a third surface and a fourth surface opposite the third surface, and a double-sided board positioned between the second surface of the first insulation layer and the third surface of the second insulation layer; forming an opening for a first via conductor in the first insulation layer; forming a first via conductor in the first via-conductor opening; after forming the first via-conductor, forming a penetrating hole for a through-hole conductor that penetrates through the intermediate substrate; forming a cylindrical through-hole conductor on the inner wall of the penetrating hole for a through-hole conductor; filling a resin filler in the cylindrical through-hole conductor; and forming a covering circuit to cover the resin filler.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
    a multilayer core substrate comprising a first insulation layer, a second insulation layer and a double-sided board interposed between the first insulation layer and the second insulation layer;
    a first buildup layer formed on a first surface of the multilayer core substrate; and
    a second buildup layer formed on a second surface of the multilayer core substrate,
    wherein the multilayer core substrate has a first conductive layer formed on the first insulation layer, a second conductive layer formed between the first insulation layer and the double-sided board, a third conductive layer formed between the second insulation layer and the double-sided board, a fourth conductive layer formed on the second insulation layer, and a cylindrical through-hole structure comprising a cylindrical conductor formed on a wall of a penetrating hole penetrating through the first insulation layer, the double-sided board and the second insulation layer such that the cylindrical conductor is connecting the first conductive layer and the fourth conductive layer, a resin filler filling a space formed inside the cylindrical conductor and a plurality of covering circuits covering the resin filler at end portions of the cylindrical conductor, respectively, the first conductive layer includes a first through-hole land formed around one of the end portions of the cylindrical through-hole structure such that the first through-hole land is directly connected to the cylindrical conductor, the first through-hole land includes a first electroless plated film, a first electrolytic plated film formed on the first electroless plated film, a second electroless plated film formed on the first electrolytic plated film and a second electrolytic plated film formed on the second electroless plated film, and the cylindrical conductor is comprising the second electroless plated film and the second electrolytic plated film formed on the second electroless plated film such that the second electroless plated film is in contact with side walls of the first electroless plated film and first electrolytic plated film exposed by the penetrating hole of the multilayer core substrate.

2. The printed wiring board according to claim 1, wherein the first through-hole land includes a metal foil, the first electroless plated film formed on the metal foil, the first electrolytic plated film formed on the first electroless plated film, the second electroless plated film formed on the first electrolytic plated film and the second electrolytic plated film formed on the second electroless plated film, and the cylindrical conductor is comprising the second electroless plated film and the second electrolytic plated film formed on the second electroless plated film such that the second electroless plated film is in contact with a side wall of the metal foil and the side walls of the first electroless plated film and first electrolytic plated film exposed by the penetrating hole of the multilayer core substrate.

3. The printed wiring board according to claim 2, wherein the multilayer core substrate has a first via conductor penetrating through the first insulation layer and connecting the first conductive layer and the second conductive layer, and the first via conductor is comprising the first electroless plated film and the first electrolytic plated film formed on the first electroless plated film.

4. The printed wiring board according to claim 3, wherein one of the covering circuits is formed such that the covering circuit is extending over the first through-hole land and is comprising a third electroless plated film formed on the second electrolytic plated film and a third electrolytic plated film formed on the third electroless plated film.

5. The printed wiring board according to claim 4, wherein the first conductive layer includes the metal foil, the first electroless plated film formed on the metal foil, the first electrolytic plated film formed on the first electroless plated film, the second electroless plated film formed on the first electrolytic plated film, the second electrolytic plated film formed on the second electroless plated film, the third electroless plated film formed on the second electrolytic plated film, and the third electrolytic plated film formed on the third electroless plated film such that the second electroless plated film, the second electrolytic plated film, the third electroless plated film and the third electrolytic plated film are formed over the first via conductor.

6. The printed wiring board according to claim 2, wherein the double-sided board includes the second conductive layer, the third conductive layer and an insulation layer interposed between the second conductive layer and the third conductive layer.

7. The printed wiring board according to claim 2, wherein one of the covering circuits is formed such that the covering circuit is extending over the first through-hole land and is comprising a third electroless plated film formed on the second electrolytic plated film and a third electrolytic plated film formed on the third electroless plated film.

8. The printed wiring board according to claim 7, wherein the first conductive layer includes the metal foil, the first electroless plated film formed on the metal foil, the first electrolytic plated film formed on the first electroless plated film, the second electroless plated film formed on the first electrolytic plated film, the second electrolytic plated film formed on the second electroless plated film, the third electroless plated film formed on the second electrolytic plated film, and the third electrolytic plated film formed on the third electroless plated film such that the second electroless plated film, the second electrolytic plated film, the third electroless plated film and the third electrolytic plated film are formed over the first via conductor.

9. The printed wiring board according to claim 8, wherein the double-sided board includes the second conductive layer, the third conductive layer and an insulation layer interposed between the second conductive layer and the third conductive layer.

10. The printed wiring board according to claim 3, wherein the first conductive layer includes the metal foil, the first electroless plated film formed on the metal foil, the first electrolytic plated film formed on the first electroless plated film, the second electroless plated film formed on the first electrolytic plated film, the second electrolytic plated film formed on the second electroless plated film, a third electroless plated film formed on the second electrolytic plated film, and a third electrolytic plated film formed on the third electroless plated film.

11. The printed wiring board according to claim 10, wherein the first conductive layer includes the metal foil, the first electroless plated film formed on the metal foil, the first electrolytic plated film formed on the first electroless plated film, the second electroless plated film formed on the first electrolytic plated film, the second electrolytic plated film formed on the second electroless plated film, the third electroless plated film formed on the second electrolytic plated film, and the third electrolytic plated film formed on the third electroless plated film such that the second electroless plated film, the second electrolytic plated film, the third electroless plated film and the third electrolytic plated film are formed over the first via conductor.

12. The printed wiring board according to claim 1, wherein the multilayer core substrate has a first via conductor penetrating through the first insulation layer and connecting the first conductive layer and the second conductive layer, and the first via conductor is comprising the first electroless plated film and the first electrolytic plated film formed on the first electroless plated film.

13. The printed wiring board according to claim 12, wherein one of the covering circuits is formed such that the covering circuit is extending over the first through-hole land and is comprising a third electroless plated film formed on the second electrolytic plated film and a third electrolytic plated film formed on the third electroless plated film.

14. The printed wiring board according to claim 13, wherein the first conductive layer includes the metal foil, the first electroless plated film formed on the metal foil, the first electrolytic plated film formed on the first electroless plated film, the second electroless plated film formed on the first electrolytic plated film, the second electrolytic plated film formed on the second electroless plated film, the third electroless plated film formed on the second electrolytic plated film, and the third electrolytic plated film formed on the third electroless plated film such that the second electroless plated film, the second electrolytic plated film, the third electroless plated film and the third electrolytic plated film are formed over the first via conductor.

* * * * *